United States Patent
Partridge

(10) Patent No.: US 9,876,330 B1
(45) Date of Patent: Jan. 23, 2018

(54) WAVELENGTH TUNABLE EXTERNAL CAVITY QUANTUM CASCADE LASER UTILIZING AN ANGLE TUNED IMMERSION GRATING AS A WAVELENGTH SELECTIVE FILTER ELEMENT

(71) Applicant: Agilent Technologies, Inc., Santa Clara, CA (US)

(72) Inventor: Guthrie Partridge, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/419,859

(22) Filed: Jan. 30, 2017

(51) Int. Cl.
*H01S 3/08* (2006.01)
*H01S 5/14* (2006.01)
*H01S 3/136* (2006.01)
*H01S 5/34* (2006.01)
*H01S 5/10* (2006.01)
*H01S 3/10* (2006.01)
*H01S 3/125* (2006.01)

(52) U.S. Cl.
CPC ............ *H01S 5/141* (2013.01); *H01S 3/1003* (2013.01); *H01S 3/125* (2013.01); *H01S 3/136* (2013.01); *H01S 5/1025* (2013.01); *H01S 5/1092* (2013.01); *H01S 5/14* (2013.01); *H01S 5/34* (2013.01); *H01S 5/3401* (2013.01)

(58) Field of Classification Search
CPC ... H01S 5/141; H01S 5/34; H01S 5/14; H01S 5/1092; H01S 5/3401; H01S 5/1025; H01S 3/125; H01S 3/1003
See application file for complete search history.

(56) References Cited

U.S. PATENT DOCUMENTS

| 4,475,792 A | 10/1984 | Sica | |
|---|---|---|---|
| 5,771,252 A * | 6/1998 | Lang | ............ H01S 5/141 372/102 |
| 2003/0193974 A1* | 10/2003 | Frankel | ............ H01S 5/4062 372/20 |
| 2006/0239324 A1* | 10/2006 | Akagawa | ............ G02B 26/0841 372/99 |
| 2013/0195129 A1* | 8/2013 | Coleman | ............ H01S 3/10053 372/20 |

* cited by examiner

*Primary Examiner* — Kinam Park

(57) ABSTRACT

A light source having a gain chip, a retro reflecting prism and a first actuator is disclosed. The gain chip amplifies light passing therethrough. The retro reflecting prism is characterized by a pivot axis within the retro reflecting prism, an input light direction, an output light direction, and a diffraction grating that receives light emitted by the gain chip traveling in the input direction, returns a diffracted light beam to the gain chip along the input light direction and generates an output light beam. The first actuator causes the retro reflecting prism to rotate about the pivot axis in response to a control signal being coupled to the first actuator.

10 Claims, 9 Drawing Sheets

WAVELENGTH TUNABLE EXTERNAL CAVITY QUANTUM CASCADE LASER UTILIZING AN ANGLE TUNED IMMERSION GRATING AS A WAVELENGTH SELECTIVE FILTER ELEMENT

BACKGROUND

A tunable external cavity laser light source is typically constructed from a reflective cavity having a gain chip and a wavelength selective filter that suppresses light of a wavelength outside a narrow band of wavelengths. The light that is passed by the filter is amplified by the gain chip via stimulated emission. A portion of the light is removed from the cavity and becomes the output beam from the light source. For any given cavity length, the gain chip can lase in a number of different modes. Ideally, only one of these modes is selected by the wavelength filter. If the passband of the filter is too great, the light source can jump between modes of the cavity with corresponding jumps in wavelength and other properties of the output light beam. Accordingly, it is advantageous to provide a wavelength filter with as narrow a passband as possible, while providing a means to change the center frequency of the passband when the light source is tuned to a new frequency.

SUMMARY

The present invention includes a light source having a gain chip, a retro reflecting prism and a first actuator. The gain chip amplifies light passing therethrough. The retro reflecting prism is characterized by a pivot axis within the retro reflecting prism, an input light direction, an output light direction, and a diffraction grating that receives light emitted by the gain chip traveling in the input direction, returns a diffracted light beam to the gain chip along the input light direction and generates an output light beam. The first actuator causes the retro reflecting prism to rotate about the pivot axis in response to a control signal being coupled to the first actuator.

In one aspect of the invention, the light source includes a second actuator that causes the retro reflecting prism and the first actuator to move in a direction orthogonal to the output beam direction.

In another aspect of the invention, the output beam light direction is parallel to the input light direction.

In another aspect of the invention, the gain chip includes a reflecting surface that forms a cavity having one end on the reflecting surface and another end on the diffraction grating.

In another aspect of the invention, the light source includes an optical assembly that generates a collimated beam traveling in the input light direction from light leaving the gain chip and focuses light in the diffracted light beam into the gain chip.

In another aspect of the invention, the retro reflecting prism is constructed from a material having an index of refraction greater than 1.

In another aspect of the invention, the retro reflection prism is constructed from a material having an index of refraction equal to 1. In one exemplary embodiment, the material includes germanium. In another exemplary embodiment, the medium is chosen from the group consisting of Si, ZnSe, InP, and CdZnTe.

In another aspect of the invention, the retro reflecting prism is characterized by a planar diffraction grating, a planar entrance face through which the input beam passes, and a reflector at right angles to the planar diffraction grating, the pivot axis is parallel to a junction of the planar diffraction grating and the reflector and is displaced from the entrance face along a normal to the entrance face that passes through the junction.

DETAILED DESCRIPTION

Figure 1:
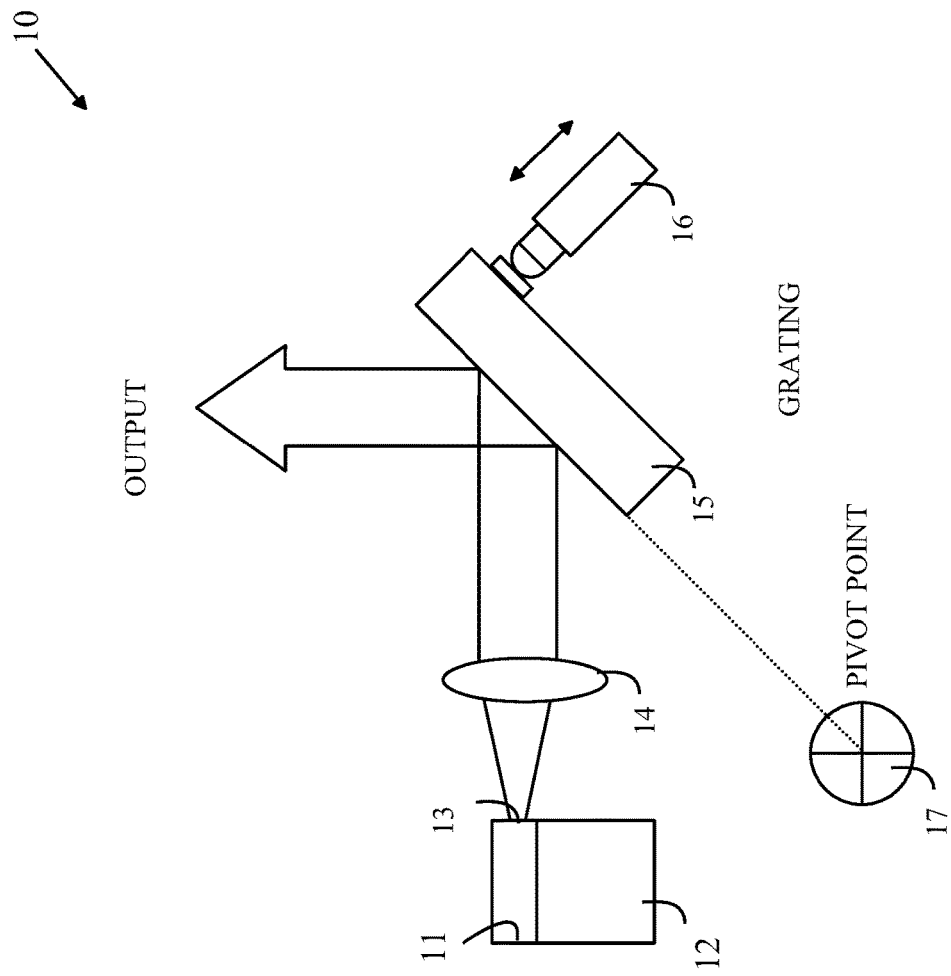
FIG. 1 illustrates one configuration used in a prior art external cavity quantum cascade laser.

The manner in which the present invention provides its advantages can be more easily understood with reference to FIG. 1, which illustrates one configuration used in a prior art external cavity quantum cascade laser. The laser cavity is defined by back facet 11 of gain chip 12 and the surface of diffraction grating 15. In an ideal system, the angle of the diffraction grating relative to the light beam from the gain chip is chosen to ensure that the laser lases on a particular mode. The angle is set by an actuator 16 that rotates the grating around a pivot axis 17 that is chosen such that the wavelength of the diffracted light that returns to the gain chip and the length of the laser cavity are maintained to provide the desired output wavelength. Lens 14 collimates the light leaving front surface 13 of gain chip 12. Lens 14 sets the diameter of the beam striking diffraction grating 15 and also sets the diameter of the output beam in this configuration.

The number of grating grooves that are illuminated by the beam on the surface of diffraction grating 15 sets the resolution of diffraction grating 15, larger beam diameters providing better resolution for any given grating. In particular, at any given wavelength, the passband width is inversely proportional to the number of grating grooves that are illuminated by the incident beam. Hence, it is advantageous to illuminate as many grating grooves as possible. In principle, the number of grating grooves that are illuminated can be increased by increasing the diameter of lens 14. However, providing a larger lens results in an economic penalty, since the lens cost also increases significantly with lens diameter. In addition, the physical size of diffraction grating 15 may also need to be increased, which further increases the cost of the light source.

The present invention is based on the observation that the number of lines that are illuminated on the diffraction grating can be increased by decreasing the line spacing on the diffraction grating. For a given wavelength and angle of the light beam on the diffraction grating, the spacing of the grooves on the diffraction grating is proportional to the wavelength of the incident light. If the wavelength of the light that strikes the diffraction grating grooves can be reduced, then the number of lines that are illuminated can be increased. The wavelength of the light striking the diffraction grating can be reduced while still maintaining the wavelength of the light that is processed by the gain chip and output from the light source by immersing the diffraction grating in a medium that has a high index of refraction. If the index of refraction of that medium is n, then the spacing of the lines on the diffraction grating can be reduced by a factor of n. In effect, the immersion medium shortens the incident light wavelength prior to the light striking the diffraction grating. Upon leaving the immersion medium, the wavelength is returned the original wavelength.

Figure 2:
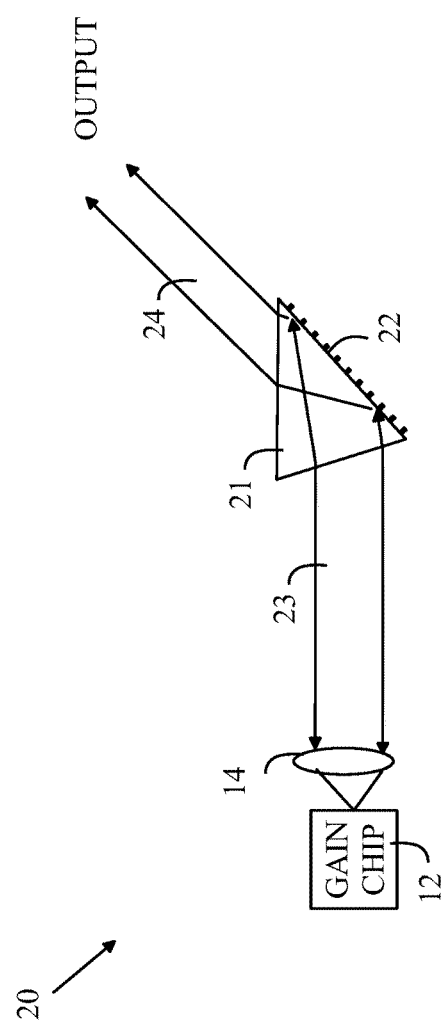
FIG. 2 illustrates a configuration for an external cavity quantum cascade laser according to one embodiment of the present invention.

Refer now to FIG. 2, which illustrates a configuration for an external cavity quantum cascade laser according to one embodiment of the present invention. Laser 20 differs from laser 10 shown in FIG. 1 in that diffraction grating 15 has been replaced by a diffraction grating 22 that is formed on the outer surface of a prism 21 constructed from a high index of refraction material. Diffraction grating 22 is formed by scribing lines into the surface of prism 21. The lines have a spacing that is 1/n that of the lines on diffraction grating 15, where n is the index of refraction of the prism material.

To tune the cavity to a different wavelength, diffraction grating 22 must be rotated relative to the direction of input beam 23. Unfortunately, rotating diffraction grating 22 about pivot axis 17 results in the direction of output beam 24 changing, which presents challenges for any apparatus using laser 20 as a tunable light source. The manner in which the output beam shifts can be more easily understood with reference to FIG. 3, which illustrates the shift in the output beam when the diffraction grating is rotated. The two positions of diffraction grating 22 are shown at 22a and 22b. Input beam 23 and the reflected first order refraction at the desired wavelength must traverse the same light path for the gain chip to amplify the light at the desired wavelength. The output beam from position 22a is shown at 31, and that from position 22b is shown at 32. The direction of each output beam is set by the angle of incidence of the input beam with respect to the normal to diffraction grating 22 in the corresponding position. Hence, the output beam direction shifts by an angle φ when diffraction grating 22 moves from position 22a to position 22b. An apparatus that uses the output beam would need to compensate for the change of direction of the output beam as the laser is tuned. As noted above, such compensation presents significant challenges.

Figure 4:
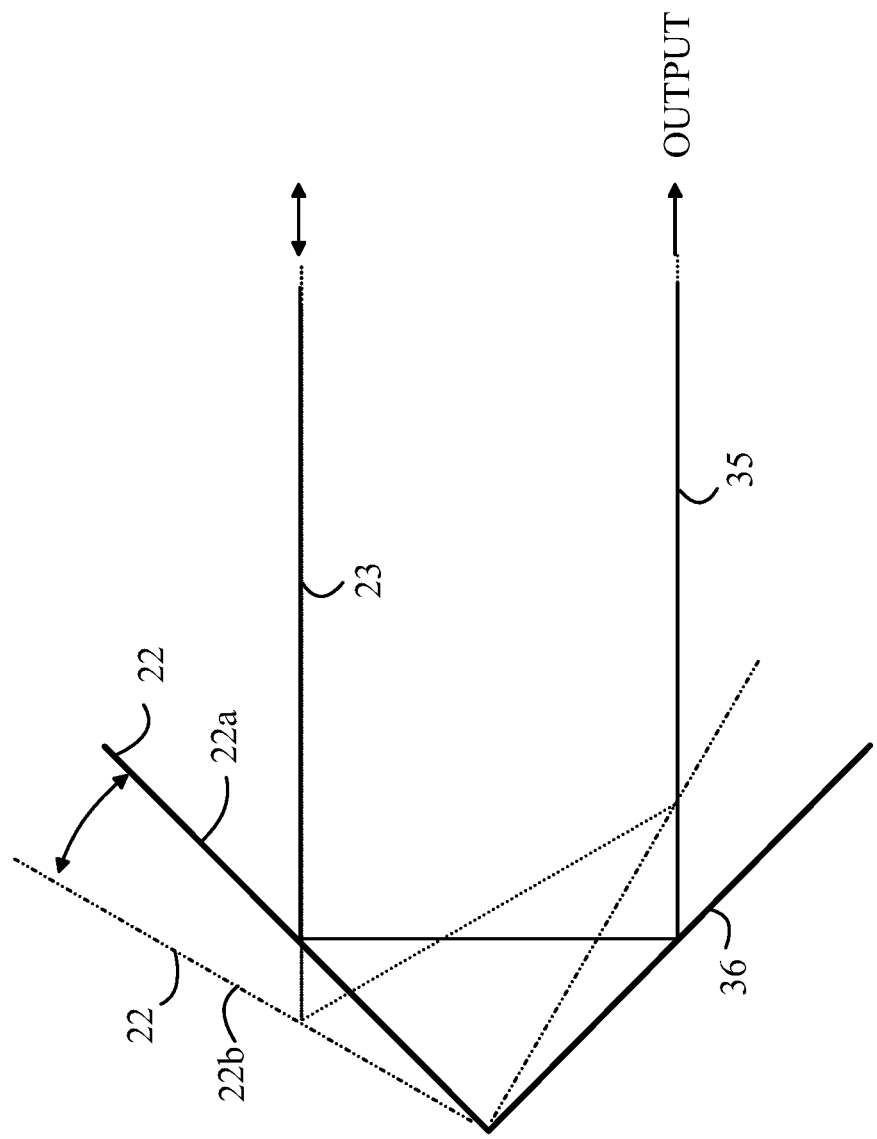
FIG. 4 illustrates an arrangement that removes the variability in the output beam direction as a function of the angle between the diffraction grating and the incoming light beam.

Refer now to FIG. 4, which illustrates an arrangement that removes the variability in the output beam direction as a function of the angle between the diffraction grating and the incoming light beam. In this embodiment, a mirror 36 rotates with diffraction grating 22 such that mirror 36 remains at 90 degrees to the plane of diffraction grating 22. In this arrangement, the output beam remains along path 35 for both rotations of diffraction grating 22.

Figure 3:
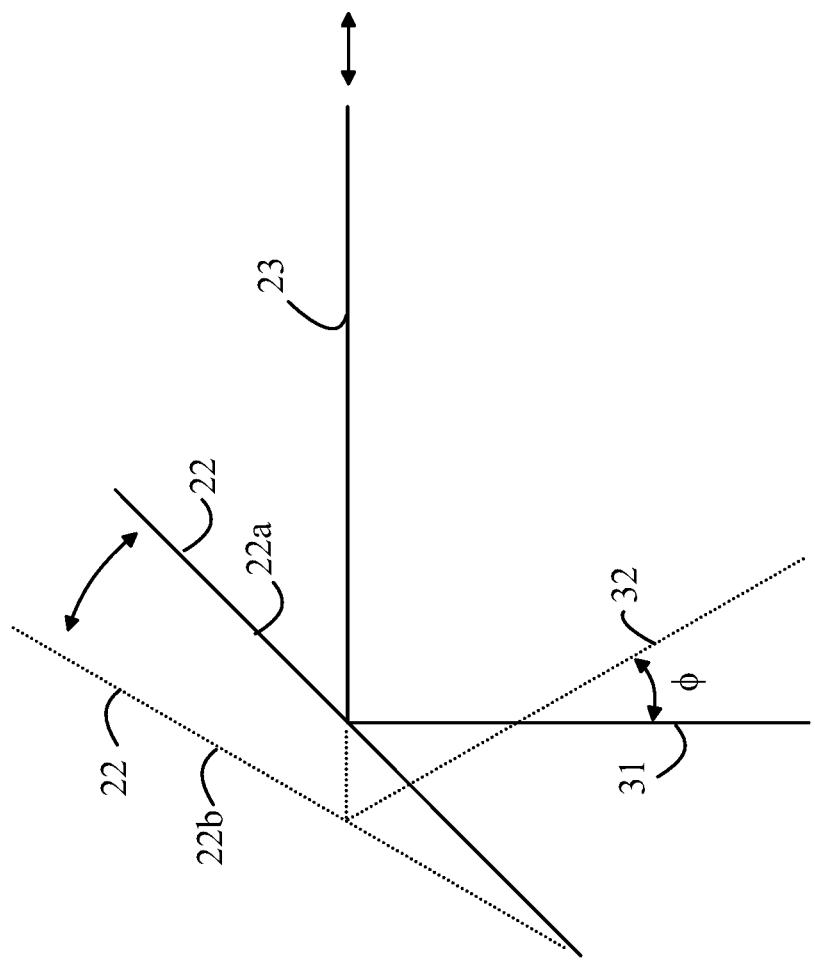
FIG. 3 illustrates the shift in the output beam when the diffraction grating is rotated.
Figure 5:
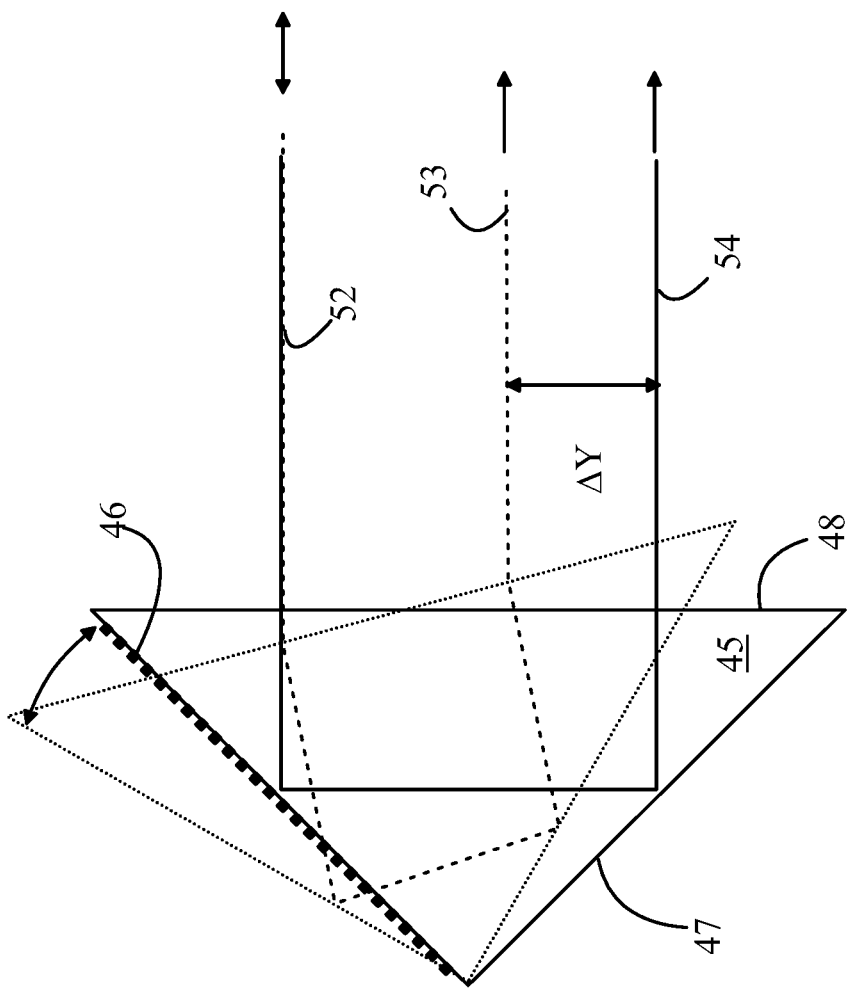
FIG. 5 illustrates the beam trajectories when the diffraction grating is on the surface of a high index of refraction prism.

The arrangements shown in FIGS. 3 and 4 assume there is no interface between materials with different indices of refraction before the light strikes diffraction grating 22. When a high index of refraction medium is included, the output beams are no longer coincident when the rotation angle of the gradient changes. Refer now to FIG. 5, which illustrates the beam trajectories when the diffraction grating is on the surface of a high index of refraction prism. To simplify the following discussion, a prism having a diffraction grating on one face and a reflecting surface on an intersecting face at right angles to the face having the diffraction grating will be referred to as a retro reflecting prism. The reflecting surface can be provided by a reflective coating or by using total internal reflection. Given that the preferred embodiments utilize a prism material having a large index of refraction, total internal reflection at the surface is the preferred embodiment. Retro reflecting prism 45 is constructed from a high index of refraction material in which a diffraction grating 46 has been formed on a first surface. A second surface 47 at right angles to diffraction grating 46 includes a mirror that alters the direction of the beam from the diffraction grating in a manner analogous to that described above. When a light beam enters or leaves the third surface shown at 48, the light beam direction is altered unless the light beam enters or leaves at right angles to surface 48. In the first rotation position, input beam 52 enters retro reflecting prism 45 at right angles to surface 48, and hence, is not bent prior to striking diffraction grating 46. The output beam 54 likewise strikes surface 48 at right angles, and hence, is also not bent.

In the second rotational position shown in dotted lines, input beam 52 is bent prior to striking diffraction grating 46 and also on leaving retro reflecting prism 45. As a result, output beam 53 is displaced relative to output beam 54 by an amount ΔY. While the two output beams are parallel to one another, the displacement still presents challenges for a device that uses a laser with this form of diffraction grating. The displacement can be eliminated by translating the gradient vertically in addition to rotating the gradient. The ideal displacement is ΔY/2. If mode-hop-free tuning of the laser is required, tuning the cavity laser requires that the cavity length be changed in addition to the center wavelength of the reflection from the diffraction grating. Hence, the prism would need to be moved along the input beam path as well as vertically to that pass. While the prism could be moved in two dimensions and also rotated during tuning, such a mechanical system increases the cost of the laser.

Figure 6:
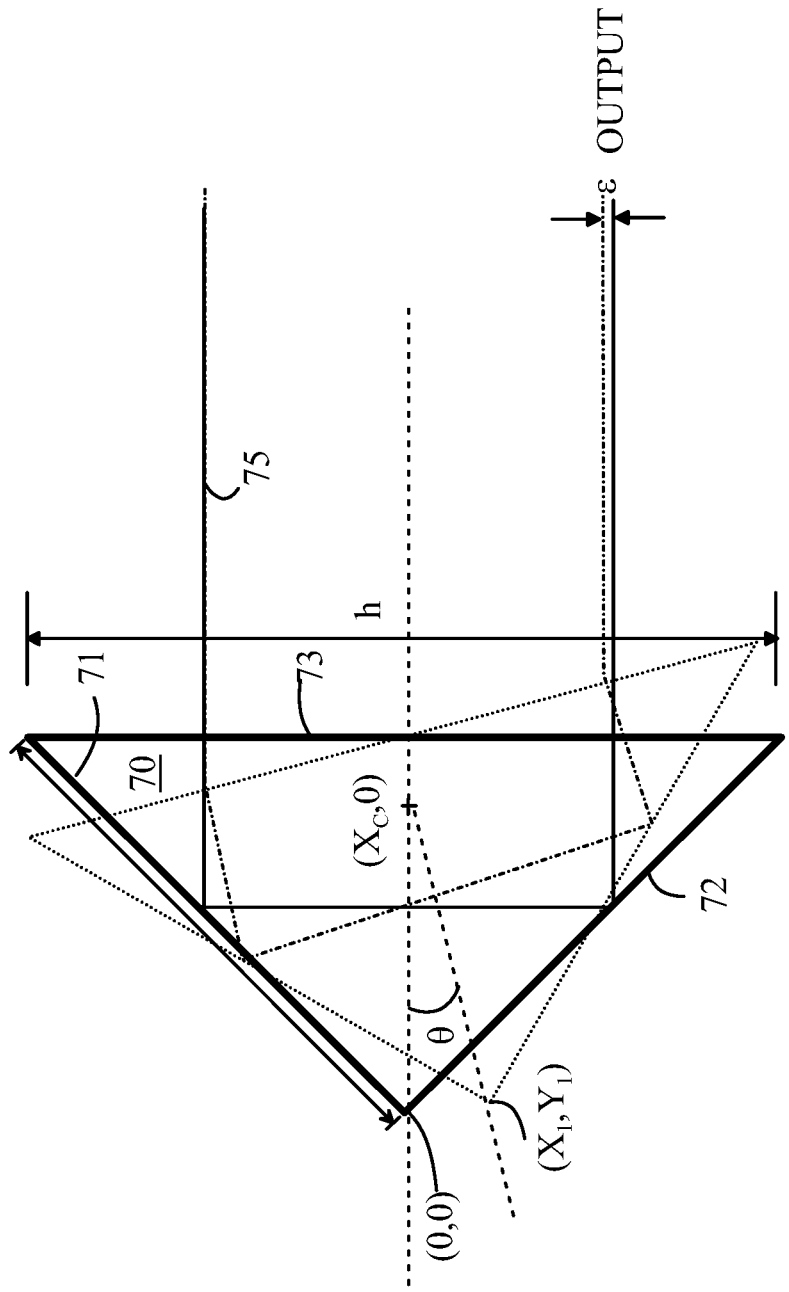
FIG. 6 illustrates the center of rotation and the input and output beams for two different angles of rotation of a retro reflecting prism according to one embodiment of the present invention about the center of rotation.
Figure 7:
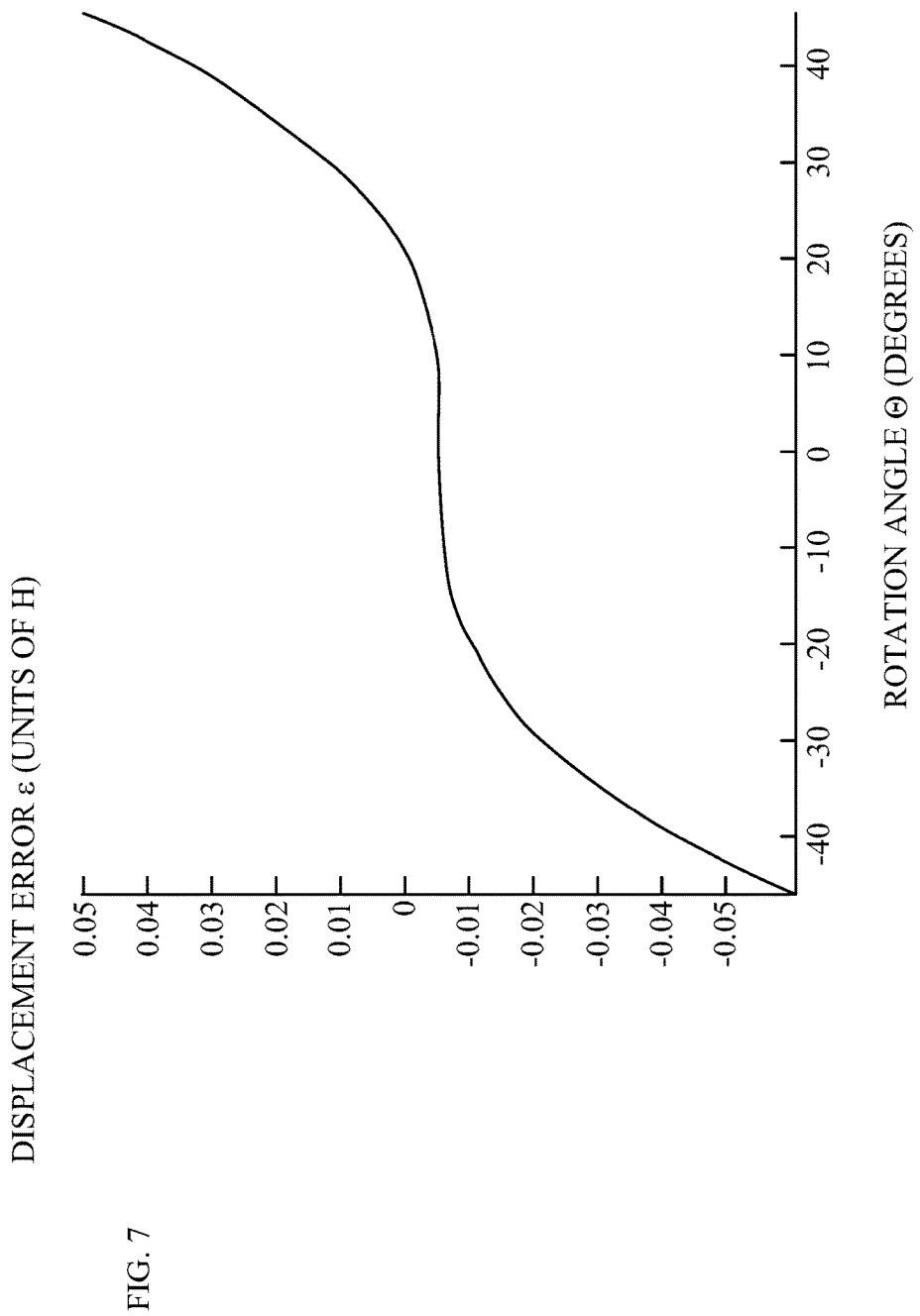
FIG. 7 illustrates the displacement error as a function of rotation angle in one embodiment of the present invention.

One aspect of the present invention is based on the observation that there is an axis of rotation that passes through the prism that has the property that when the retro reflecting prism is rotated about this axis, the retro reflecting prism translates in a manner that substantially reduces the movement of the output beam as a function of the rotation angle for angles within a useful tuning range. Refer now to FIG. 6, which illustrates the center of rotation and the input and output beams for two different angles of rotation of a retro reflecting prism according to one embodiment of the present invention about the center of rotation. The diffraction grating on retro reflecting prism 70 is on surface 71, which has a length h. To simplify the drawing, the diffraction grating grooves are not shown. The reflective surface is on side 72 of retro reflecting prism 70. Retro reflecting prism 70 rotates about an axis through point $(X_c, Y_c)$ which is perpendicular to the plane of the figure. Retro reflecting prism 70 is characterized by an angle of rotation, $\Theta$. The angle is defined to be 0 for the rotation at which input beam 75 is perpendicular to face 73 of retro reflecting prism 70. In the example shown in FIG. 6, the XY coordinate system has its origin at the junction of surface 71 and side 72. Denote the index of refraction of the medium outside of retro reflecting prism 70 by $n_1$ and the index of refraction of the material from which retro reflecting prism 70 is constructed by $n_2$. In one aspect of the invention, $Xc=(h/2)(1-n1/n2)$. For this value of Xc, the output beams will all be parallel to one another; however, there will be a small displacement error, ε. The magnitude of the displacement error, as a function of rotation angle, is shown in FIG. 7 for n1=1 and n2=4.

Figure 8:
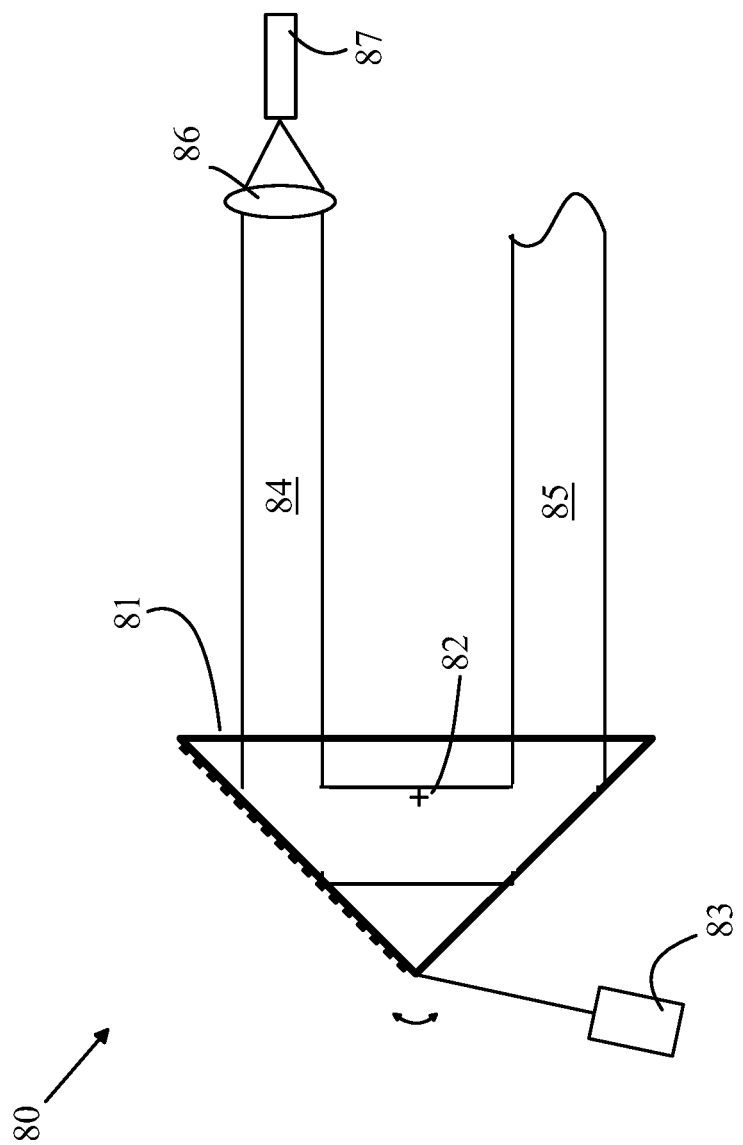
FIG. 8 illustrates an external cavity quantum cascade laser according to one embodiment of the present invention.

Refer now to FIG. 8, which illustrates an external cavity quantum cascade laser according to one embodiment of the present invention. Laser 80 includes a gain chip 87 that amplifies the light in beam 84 whose diameter is set by lens 86. The light is selectively filtered by retro reflecting prism 81 as described above. Actuator 83 causes retro reflecting prism 81 to rotate about rotational axis 82 which is perpendicular to the plane of the figure. An output beam 85 is provided by the mirrored surface of retro reflecting prism 81.

Figure 9:
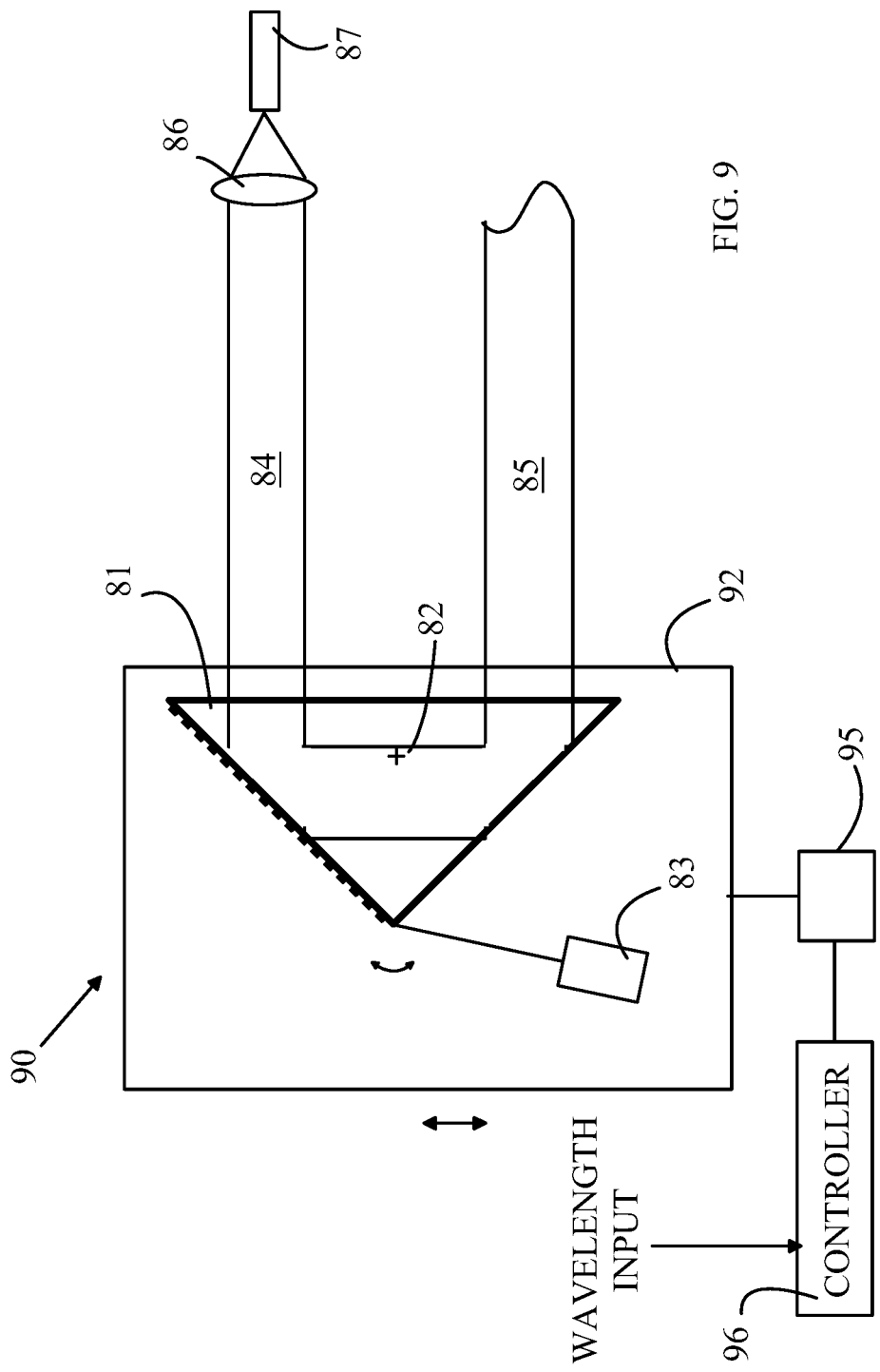
FIG. 9 illustrates an external cavity quantum cascade laser according to another embodiment of the present invention.

As noted above, the arrangement shown in FIG. 8 still has a small variation in the beam position as a function of the rotation angle. If the application requires rotation angles at which this variation is significant, an additional drive can be provided to correct for any remaining variation in position as a function of angle. Refer now to FIG. 9, which illustrates an external cavity quantum cascade laser according to another embodiment of the present invention. Those elements of laser 90 that serve functions analogous to corresponding elements shown in FIG. 8 have been given the same numerical designations and will not be discussed further here. In laser 90, retro reflecting prism 81 and actuator 83 are mounted on a stage 92 that moves relative to the direction of beam 84 and is driven by a second actuator 95. A controller 96 controls both actuator 83 and actuator 95. The controller can include a lookup table that stores the Y displacement values to be used with each angle of rotation of retro reflecting prism 81 to correct for any remaining displacement error. Controller 96 can also include a table of displacements to be used by actuator 83 in setting the rotation angle for any desired output wavelength. The desired output wavelength can be set by user input to controller 96, either directly or indirectly through some other device that is connected to controller 96.

The above-described embodiments utilize a high index of refraction medium for the retro reflecting prism. In one exemplary embodiment, the grooves are etched or machined on a Germanium crystal block. Germanium has an index of refraction of approximately 4 for light in the mid-infrared portion of the optical spectrum. However, any other IR transmissive material having an index of refraction greater than one could be utilized. For example. Si (silicon). ZnSe (zinc selenide), InP (indium phosphide), or CdZnTe (cadmium zinc telluride) could be utilized. As noted above, materials with large indices of refraction are preferred. However, any transmissive medium with an index of refraction greater than 1 will provide some improvement. In another exemplary embodiment, the retro reflecting prism medium has an index of refraction greater than 2. In one exemplary embodiment the retro reflecting prism medium has an index of refraction greater than 3.

Refer again to the arrangement shown in FIG. 2. If the material from which prism 21 is constructed exhibits chromatic dispersion, then the direction of the output beam can vary as a function of wavelength. In contrast, the embodiments shown in FIG. 6 automatically correct for any such chromatic dispersion, since the output beam is always parallel to the input beam. Hence, any dispersion introduced by the input beam entering the prism at an angle other than 90 degrees to the surface is corrected when the output beam leaves the prism.

In the above-described embodiments, the material from which the retro-reflecting prism is constructed has an index of refraction greater than 1. However, embodiments in which the prism has an index of refraction equal to one, i.e., a grating with a reflecting surface attached at right angles to the plane of the grating, has advantages in situations in which an output beam that is displaced from the input beam, but parallel thereto and which remains stationary when the grating is rotated. To simplify the following discussion, such an arrangement will also be referred to as a retro-reflecting prism.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
a gain chip that amplifies light passing therethrough;
an retro reflecting prism characterized by pivot axis within said retro reflecting prism, an input light direction, an output light direction and a diffraction grating that receives light emitted by said gain chip traveling in said input light direction, returns a diffracted light beam to said gain chip along said input light direction and generates an output light beam; and
a first actuator that causes said retro reflecting prism to rotate about said pivot axis in response to a control signal being coupled to said first actuator.

2. The light source of claim 1 further comprising a second actuator that causes said retro reflecting prism and said first actuator to move in a direction orthogonal to said output light direction.

3. The light source of claim 1 wherein said output light direction is parallel to said input light direction.

4. The light source of claim 1 wherein said gain chip further comprises a reflecting surface that forms a cavity having one end on said reflecting surface and another end on said diffraction grating.

5. The light source of claim 1 further comprising an optical assembly that generates a collimated beam traveling in said input light direction from light leaving said gain chip and focuses light in said diffracted light beam into said gain chip.

6. The light source of claim 1 wherein said retro reflecting prism is constructed from a material having an index of refraction greater than 1.

7. The light source of claim 1 wherein said retro reflecting prism is constructed from a material having an index of refraction equal to 1.

8. The light source of claim 1 wherein said material comprises germanium.

9. The light source of claim 1 wherein said material is chosen from the group consisting of Si, ZnSe, InP, and CdZnTe.

10. The light source of claim 1 wherein said retro reflecting prism is characterized by a planar diffraction grating, a planar entrance face through which an input beam passes, and a reflector at right angles to said planar diffraction grating, said pivot axis being parallel to a junction of said planar diffraction grating and said reflector and being displaced from said planar entrance face along a normal to said entrance face that passes through said junction.

* * * * *